United States Patent
Samra et al.

(10) Patent No.: US 10,522,509 B2
(45) Date of Patent: Dec. 31, 2019

(54) MODULAR VOLTAGE REGULATORS

(71) Applicant: Taiwan Semiconductor Manufacturing Co., Ltd., Hsin-Chu (TW)

(72) Inventors: Nick Samra, Austin, TX (US); Alan Roth, Leander, TX (US); Eric Soenen, Austin, TX (US); Stefan Rusu, Sunnyvale, CA (US); Paul Ranucci, Leander, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/202,639

(22) Filed: Nov. 28, 2018

(65) Prior Publication Data

US 2019/0115318 A1    Apr. 18, 2019

Related U.S. Application Data

(62) Division of application No. 15/782,885, filed on Oct. 13, 2017, now Pat. No. 10,403,600.

(51) Int. Cl.
| | | |
|---|---|---|
| *G05F 1/59* | (2006.01) | |
| *H01L 25/065* | (2006.01) | |
| *H01L 21/66* | (2006.01) | |
| *H01L 25/18* | (2006.01) | |
| *H01L 23/00* | (2006.01) | |
| *G05F 1/595* | (2006.01) | |
| *H01L 21/82* | (2006.01) | |
| *H01L 49/02* | (2006.01) | |

(52) U.S. Cl.
CPC ............ *H01L 25/0655* (2013.01); *G05F 1/59* (2013.01); *G05F 1/595* (2013.01); *H01L 21/82* (2013.01); *H01L 22/14* (2013.01); *H01L 24/10* (2013.01); *H01L 24/98* (2013.01); *H01L 25/18* (2013.01); *H01L 28/10* (2013.01)

(58) Field of Classification Search
CPC ..... H01L 25/0655; H01L 24/98; H01L 28/10; H01L 21/82; H01L 24/10; H01L 22/14; H01L 25/18; H01L 23/5227; H01L 2924/15311; H01L 2924/1592; H01L 2224/16235; H01L 2224/16227; G05F 1/59; G05F 1/595
See application file for complete search history.

(56) References Cited

U.S. PATENT DOCUMENTS

| | | | | |
|---|---|---|---|---|
| 5,408,131 A | * | 4/1995 | Khatri ................... | H01L 23/544 257/48 |
| 5,450,309 A | * | 9/1995 | Rohner ................. | H02M 7/493 307/82 |
| 6,255,726 B1 | * | 7/2001 | Vindasius ................ | H01R 4/04 257/686 |
| 9,806,620 B2 | | 10/2017 | Melendy | |
| 2013/0082669 A1 | | 4/2013 | Xu | |
| 2018/0158800 A1 | | 6/2018 | El-Mansouri | |

* cited by examiner

*Primary Examiner* — Jung Kim
(74) *Attorney, Agent, or Firm* — Duane Morris LLP

(57) ABSTRACT

A device includes a semiconductor die. The semiconductor die has formed thereon a plurality of multi-phase voltage regulator modules of the same design formed on a common semiconductor substrate.

20 Claims, 15 Drawing Sheets

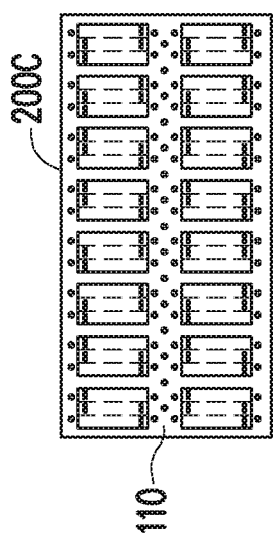
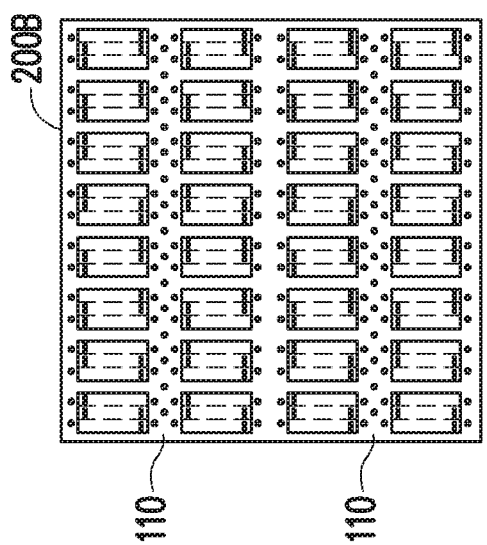
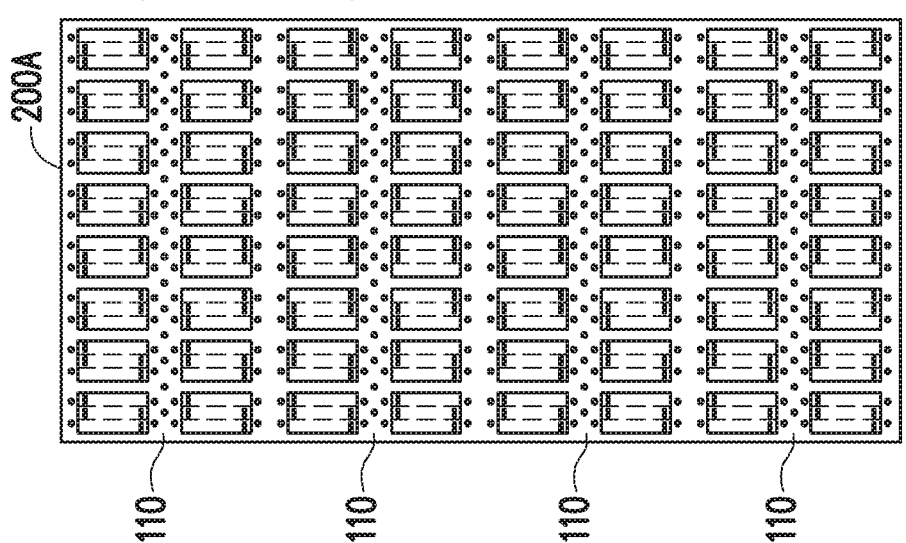

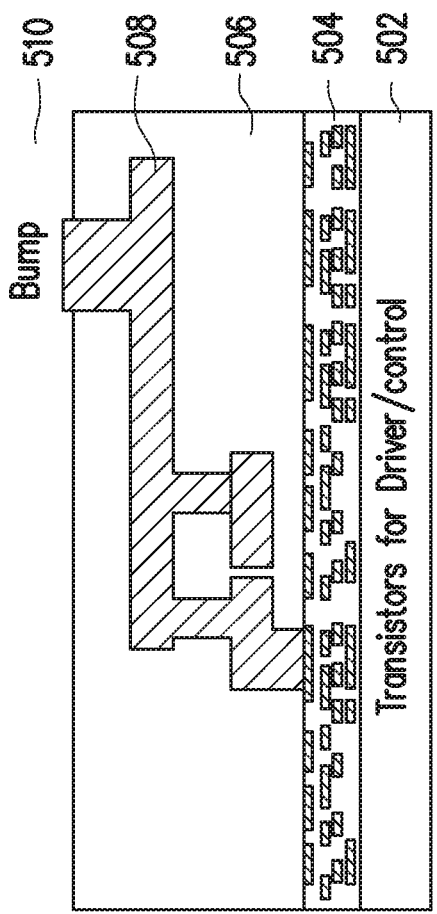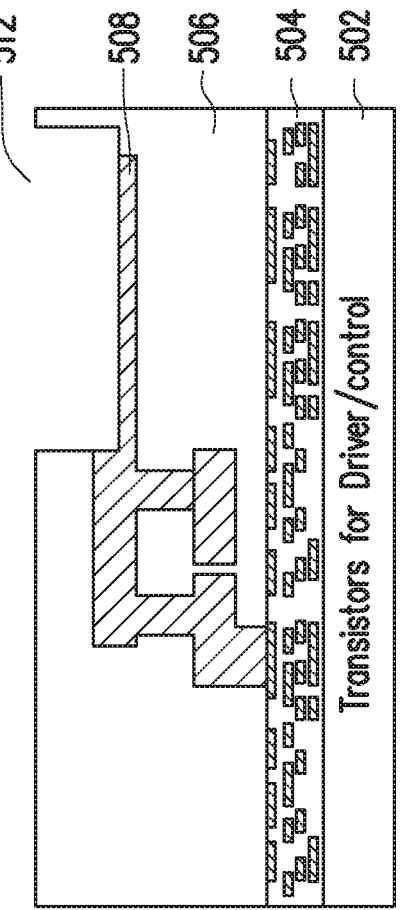

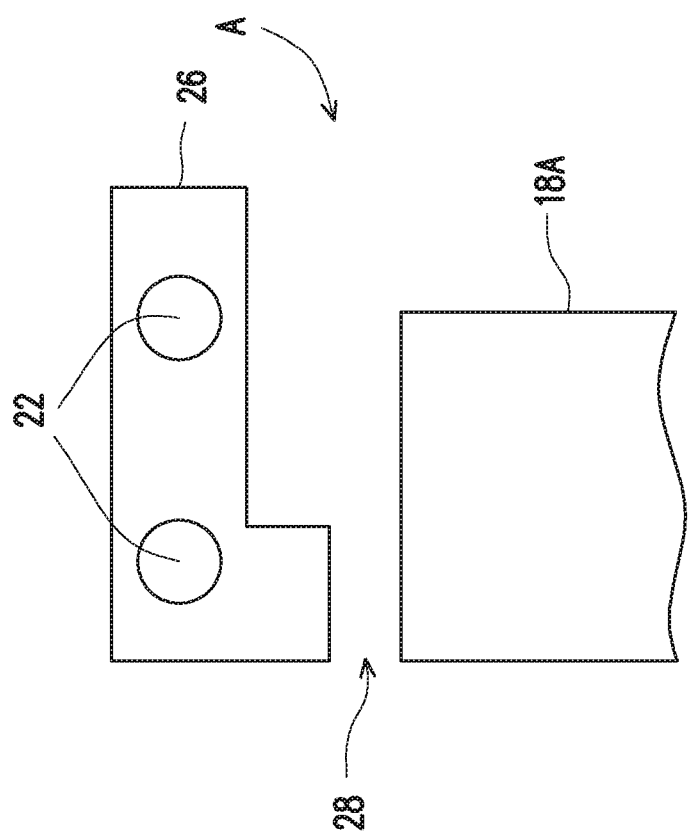

MODULAR VOLTAGE REGULATORS

CROSS-REFERENCE TO RELATED APPLICATIONS

This application is a divisional application of U.S. patent application Ser. No. 15/782,885 filed Oct. 13, 2017, the entirety of which is hereby incorporated by reference herein.

BACKGROUND

Voltage regulators are used extensively in electronic devices (e.g., computers, servers, smart phones, etc.) to regulate voltage. The needs (e.g., regulated voltage level, current draw, etc.) of these different and even similar electronic devices vary greatly. Typically, a specific voltage regulator is designed for a small range of systems (or even for an individual device) based on the input current requirements of those systems.

Inductor elements are the largest elements of the voltage regulator, and consume the most real estate. These inductor elements are one element that are subject to manufacturing defects. Voltage regulators that exhibit manufacturing defects, such as in the inductor elements, are scrapped. This results in low yield manufacturing of voltage regulators.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIG. 4A illustrates a chip having four voltage regulator modules that can be formed from the wafer of FIG. 3, according to certain embodiments.

FIG. 4B illustrates a chip having two voltage regulator modules that can be formed from the wafer of FIG. 3, according to certain embodiments.

FIG. 4C illustrates a chip having one voltage regulator module that can be formed from the wafer of FIG. 3, according to certain embodiments.

FIG. 8 illustrates a vertical cross-section of a wafer having a voltage regulator before bump removal, according to certain embodiments.

FIG. 8A illustrates a vertical cross-section of a wafer having a voltage regulator after bump removal, according to certain embodiments.

FIG. 9A is an enlarged view of a portion of FIG. 9.

DETAILED DESCRIPTION OF EXEMPLARY EMBODIMENTS

Figure 1:
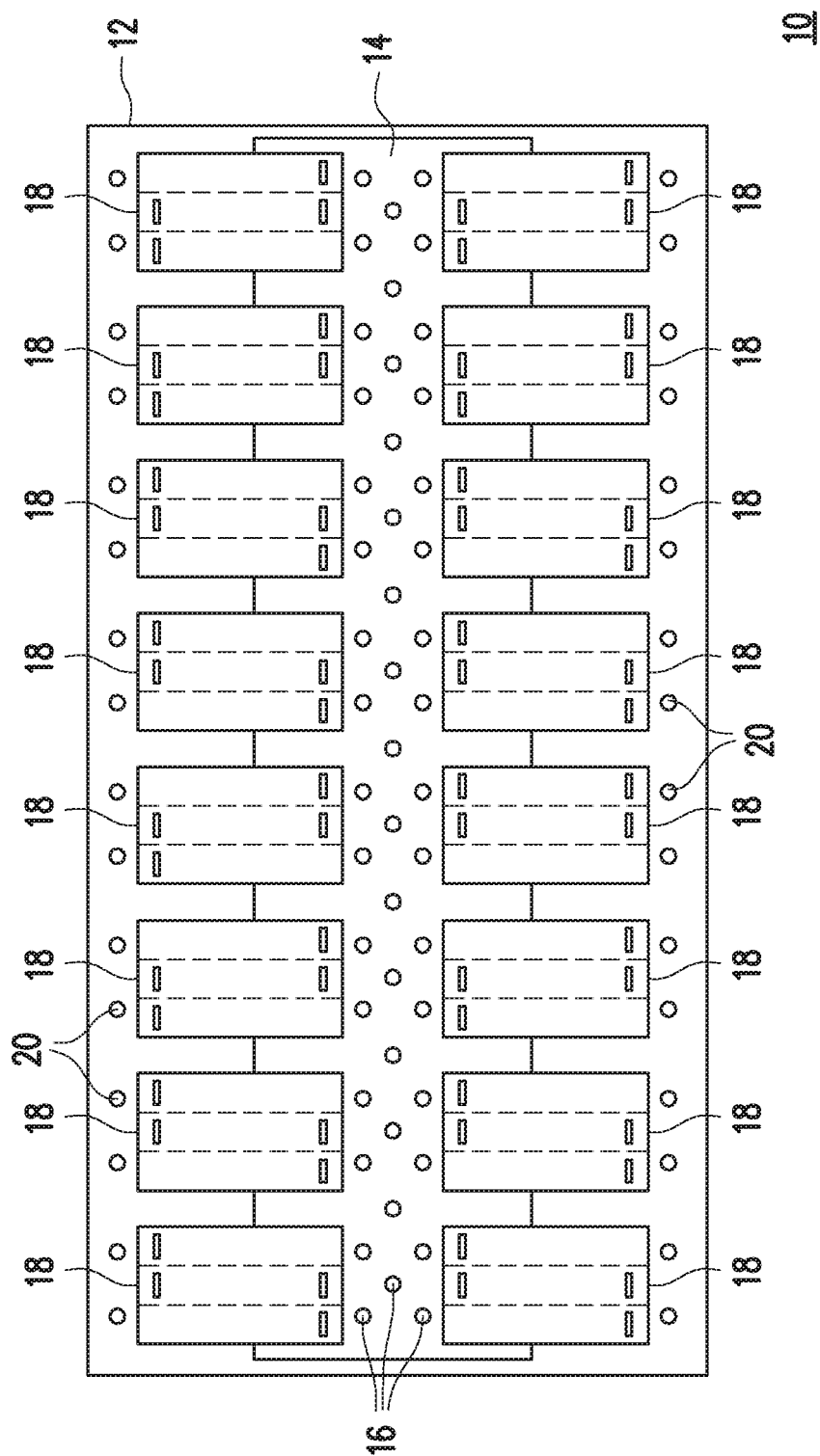
FIG. 1 illustrates an example of a multi-phase voltage regulator, according to certain embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

Disclosed herein are embodiments of a modular voltage regulator design that allows for multiple voltage regulators tailored to the design requirements of different products to be formed from an array of identical voltage regulators modules manufactured on the same wafer substrate. Specifically, in embodiments, a voltage regulator module is arrayed across a wafer that can be cut into different sized dies, containing different numbers of voltage regulator modules, based on the specific requirements of the system. The die is then packaged together with a chip to which it is to provide regulated voltage, with the package connections configuring whether the voltage regulator modules operate independently of one another, to provide, for example, multiple regulated voltages to a multi-voltage domain chip or together, such as in a master slave configuration, to provide one regulated voltage output for, for example, a high current domain. This approach allows for one voltage regulator module design to be used to provide a number of different voltage regulators.

Also disclosed herein are embodiments of a voltage regulator that is configurable to address manufacturing defects and thereby increase yield. Specifically, in embodiments, the voltage regulator design is configured with the ability to disable individual phases of the voltage regulator based on manufacturing defects and/or to reconfigure the control logic to only use the working circuits of the voltage regulator.

In embodiments, the voltage regulator can be provided in a package that provides connections to other electronic circuits, e.g., to a CPU or other electronic circuit to which the voltage regulator provides a regulated voltage and from which in certain embodiments the voltage regulator receives a reference voltage. In certain embodiments, the modular in-package voltage regulator can provide a much larger range of current delivery by coupling multiple voltage regulators together on a common substrate. In certain embodiments, the modular in-package voltage regulator can also simultaneously provide a number of different voltages from a smaller number of chips in the package than previous designs. This wide range of uses is accomplished with a single design and tape-out, rather than designing a separate product for each application, as would be required with other approaches. In addition, the effective yield of the process of making voltage regulators is better than traditional voltage regulators due to the ability to selectively disable circuits with manufacturing defects, as well as the ability to increase volume of the same design.

A "package" or "multichip package" as used herein, in embodiments, includes a voltage regulator die, typically having solder bumps, and at least one other die to which the voltage regulator provides a regulated voltage or voltages (e.g., a CPU die) also having solder bumps, coupled to and connected through a common package substrate. That single package or multichip package forms a single product that can be coupled to a printed circuit board in a larger electronic system or product.

FIG. 1 illustrates an example of a multi-phase voltage regulator, specifically a 16-phase voltage regulator 10 formed on a die 12. The term "phase" as used in the context of a "multi-phase" voltage regulator refers to time interleaving of the different clocks. Each phase is slightly offset in time (e.g. 0°, 90°, 180°, etc.) from each other. These "phased" outputs are shorted together to provide a robust output voltage of a voltage regulator, since each one has a response slightly offset from the others. The drivers and control logic are located in the center region 14 of the die 12, and the sixteen inductors 18 are placed over the circuitry layer. In certain embodiments, the inductors 18 are the largest elements of the voltage regulator, and so the inductors 18 take up more space on the die 12 than the drivers and control circuitry. That means that the size of the die needed for the voltage regulator is largely dictated by the size of and number of inductors 18. The voltage regulator input solder bumps 16 are provided for receiving both VDD and VSS reference voltages and control signals and are located in the center region 14 of the die 12 of the voltage regulator 10. The voltage regulator output (i.e., the reference voltage) is provided at the output solder bumps 20 located across the top and bottom of the die 12 of the voltage regulator 10. The output solder 20 bumps are electrically coupled to the inductor 18 outputs. It should be understood that a package in which the voltage regulator 10 is provided couples the solder bumps 20 together to provide a common output of the voltage regulator 10.

In conventional designs, a system that required a larger max current would require a separately designed voltage regulator with more phases and/or larger inductors. And systems that required several different independent voltage inputs would require several voltage regulators, such as of the type shown in FIG. 1, formed on separate substrates and separately designed for the different voltage domains. These separate voltage regulators would then be integrated into one package.

Figure 2:
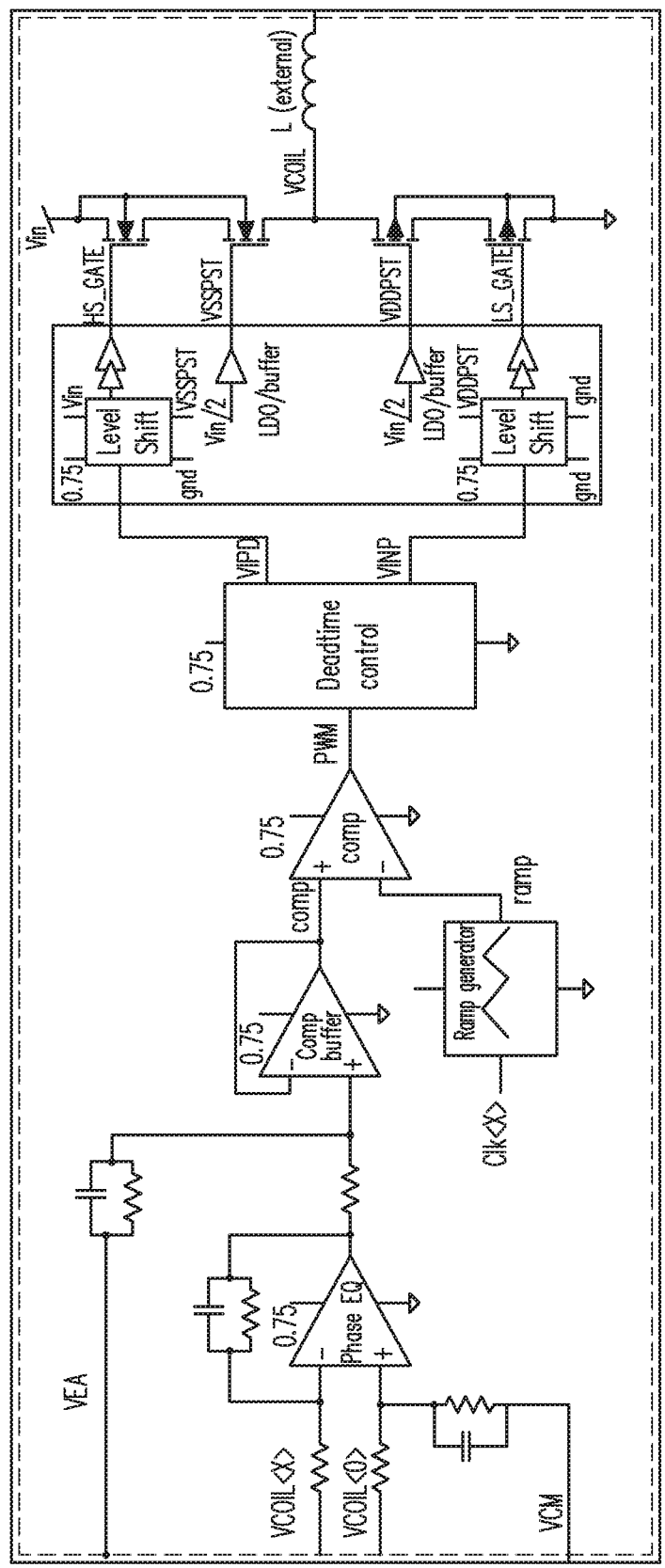
FIG. 2 shows a circuit design of an individual phase circuit of a voltage regulator, according to certain embodiments.
Figure 2A:
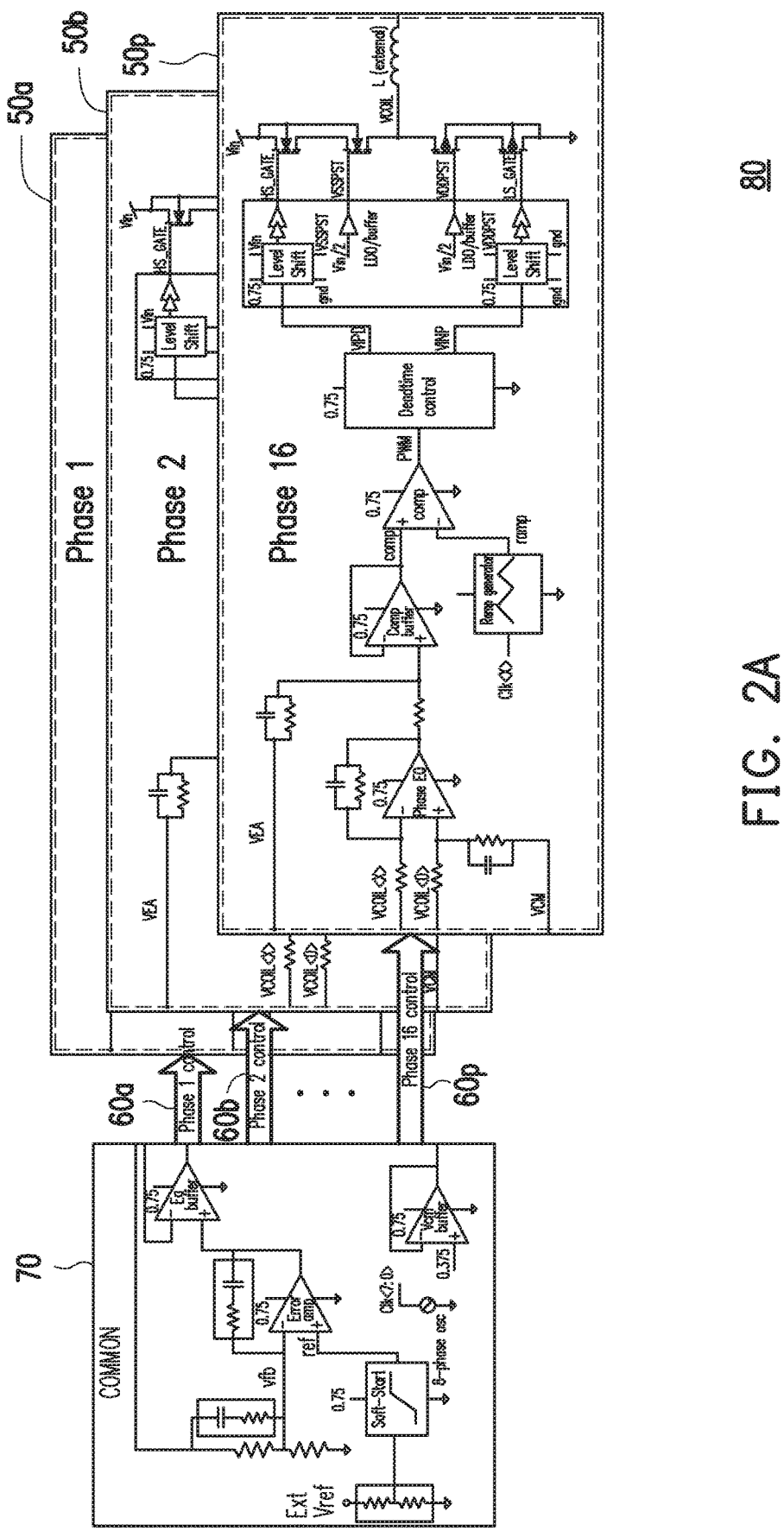
FIG. 2A shows a circuit design of a multi-phase voltage regulator circuit, according to certain embodiments.

FIG. 2 shows a circuit design of an individual phase circuit 50 of a voltage regulator, such as the voltage regulator 10 shown in FIG. 1. It should be understood that FIG. 2 is provided only for illustration purposes and any voltage regulator circuit can be used with the embodiments of the present disclosure. The specifics of the circuit design of the voltage regulator shown in FIG. 2, and other designs, are known in the art and are not described herein so as to avoid obscuring the present disclosure. As can be seen in FIG. 2, the phase circuit 50 includes an inductor labeled "L (external)" that corresponds to one of the inductors 18 shown in FIG. 1. FIG. 2A shows a circuit design of a multi-phase voltage regulator circuit 80. Assuming sixteen phases, the voltage regulator phase circuit 50 is replicated for each phase of the voltage regulator. One control block 70 drives all the phases, and can be configured to drive up to n phases depending on the maximum number of voltage regulator modules that may be aggregated together into one voltage regulator as described below. The main inputs are the reference voltage (VREF shown in control block 70 of FIG. 2A), along with the control settings for the desired voltage. The output of each phase is the signal VCOIL provided through the attached, corresponding inductor (L). VREF is compared to the desired voltage. If VREF is lower, the signal HS GATE (FIG. 2) is enabled, raising the voltage at the output. If VREF is higher, the signal LS GATE (FIG. 2) is enabled, lowering the output voltage. This operation is continuously performed to drive the voltage in the device connected to the output (as measured by the feedback mechanism VREF) to the target voltage.

Figure 3:
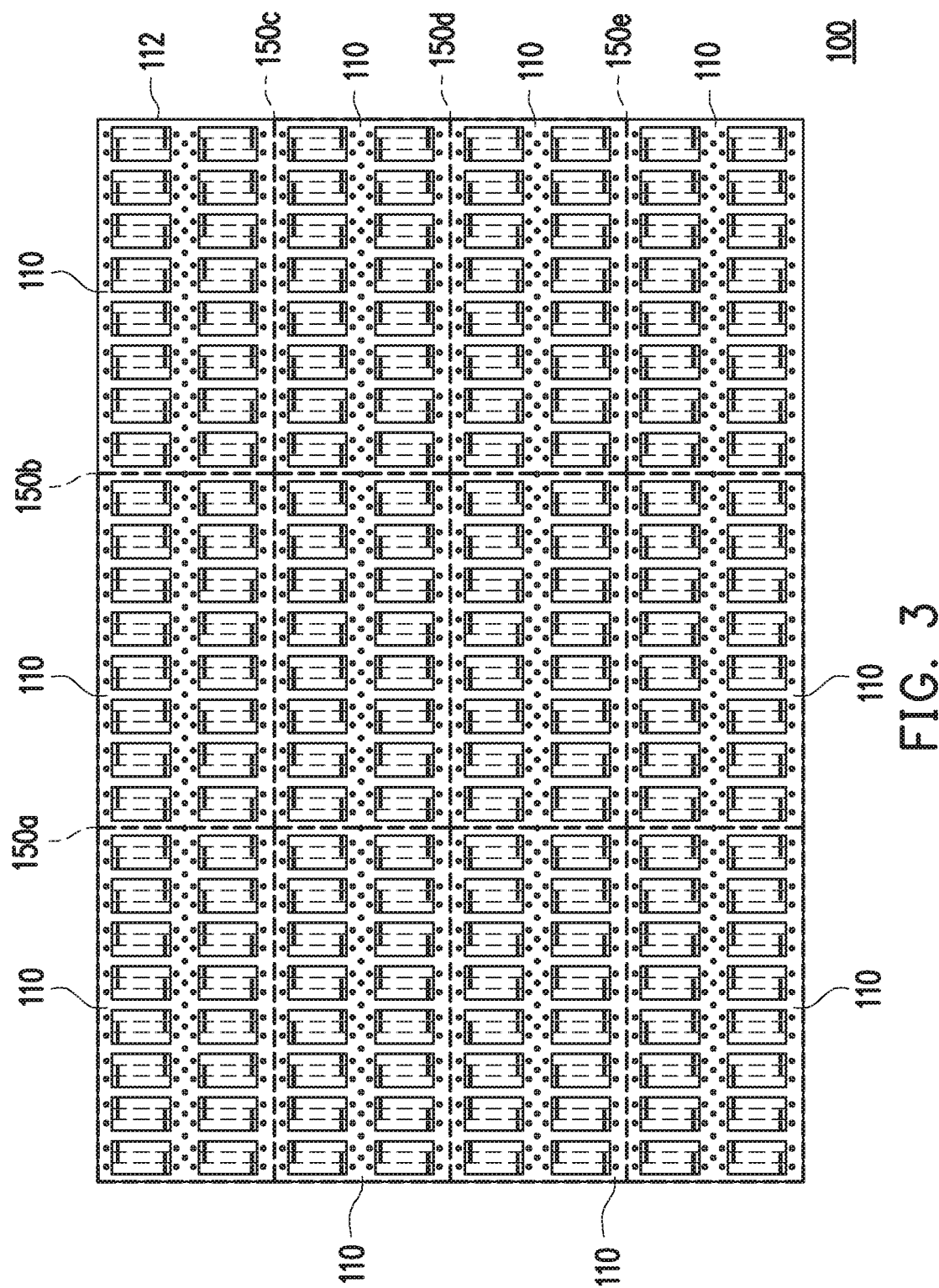
FIG. 3 illustrates a portion of a wafer on which multiple voltage regulators of the type shown in FIG. 1 are arrayed across the wafer, according to certain embodiments.

FIG. 3 illustrates a portion of a wafer 100 on which multiple voltage regulator modules 110 of the type shown in FIG. 1 are arrayed out on the wafer 100. Specifically, an array of twelve voltage regulator modules 110 are shown in FIG. 3, though this number is selected simply for illustrative purposes. Scribe lines 150 are shown between each module. The wafer 100 can be cut, in a selective manner, along one or more scribe lines 150 into different sized dies based on the number of voltage regulator modules 110 required for an individual design, e.g. 1, 2, 4, or 8 modules per die. It should be appreciated that the number of voltage regulator modules 110 per chip need not be a power of 2 and any number between 1 and the total number of voltage regulator modules 110 on the wafer 100 could be selected. FIG. 4A, FIG. 4B and FIG. 4C illustrate chips 200A, 200B and 200C having four, two and one voltage regulator modules 110, respectively. For example, the voltage regulator chip 200A could be formed by cutting along scribe line 150a and/or 150b. The voltage regulator chip 200B could be formed by cutting along scribe line 150a and 150c or 150e. That same scribe line selection will also provide a voltage regulator chip 200c. It should be understood that the voltage regulator chip size, and thus the number of voltage regulator modules, is selected based on the number of voltage rails needed in the package and/or the current requirements of each rail.

Figure 5:
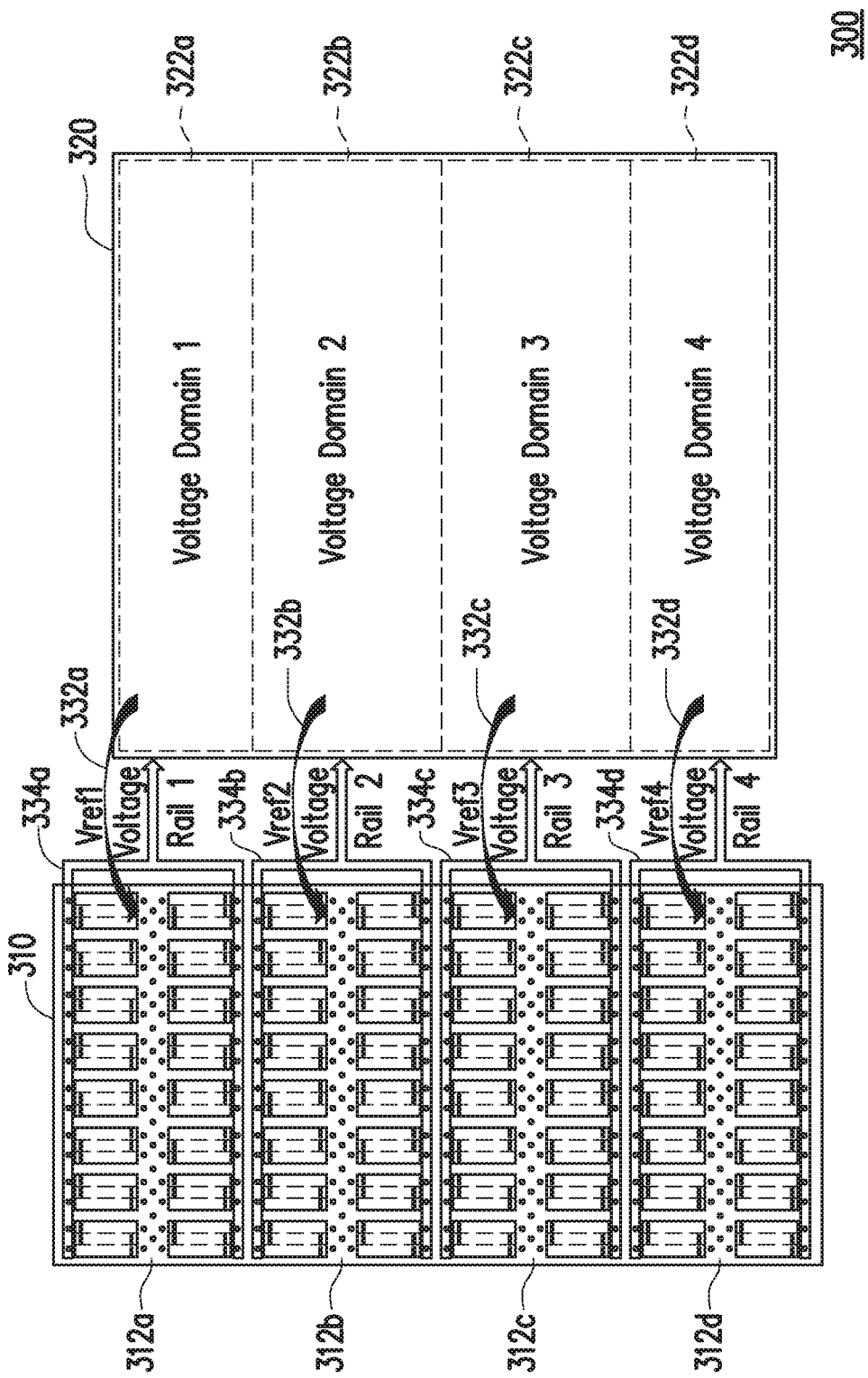
FIG. 5 schematically illustrates a multichip package including a voltage regulator chip and a multi-voltage rail chip, according to certain embodiments.

FIG. 5 schematically illustrates a multichip package 300 including a voltage regulator chip 310 and a multi-voltage rail chip 320, such as a CPU chip having multiple voltage domains, according to certain embodiments. In this example, the voltage regulator chip 310 includes N-number voltage regulator modules and the chip 320 includes N voltage domains. In the illustrated embodiment, N is four though it should be understood that this is for illustrative purposes only and N can be any integer number. Voltage regulator chip 310 includes identical voltage regulator modules 312a, 312b, 312c and 312d formed on a common die in the manner discussed above in connection with FIG. 4A. The chip 320 includes four voltage domains, namely a first voltage domain 322a, a second voltage domain 322b, a third voltage domain 322c and a fourth voltage domain 322d. Each voltage regulator module 312 is connected to and associated with a respective one of the voltage domains 322 through the package. The package provides, for example, a connection 332a through which a reference voltage and/or control signals are provided from the first voltage domain 322a of the chip 320 to the input solder bumps of first voltage regulator module 312a of the voltage regulator chip 310. The package also provides a common electrical connection (rail) 334a connecting the output solder bumps of the voltage regulator module 312a to the first voltage domain 322a. Similarly, the package provides connections 332b and 334b between the second voltage domain 332b and second voltage regulator module 312b; connections 332c and 334c between the third voltage domain 332c and third voltage regulator module 312c; and connections 332d and 334d between the fourth voltage domain 332d and fourth voltage regulator module 312d. In this embodiment, one voltage regulator chip 310 includes multiple voltage regulator modules 312 and each is configured to independently control a respective voltage rail from a respective voltage references (Vref) of the respective voltage domain on the chip 320. As such, one voltage regulator die can provide multiple reference voltages for a multi-domain chip.

Figure 6:
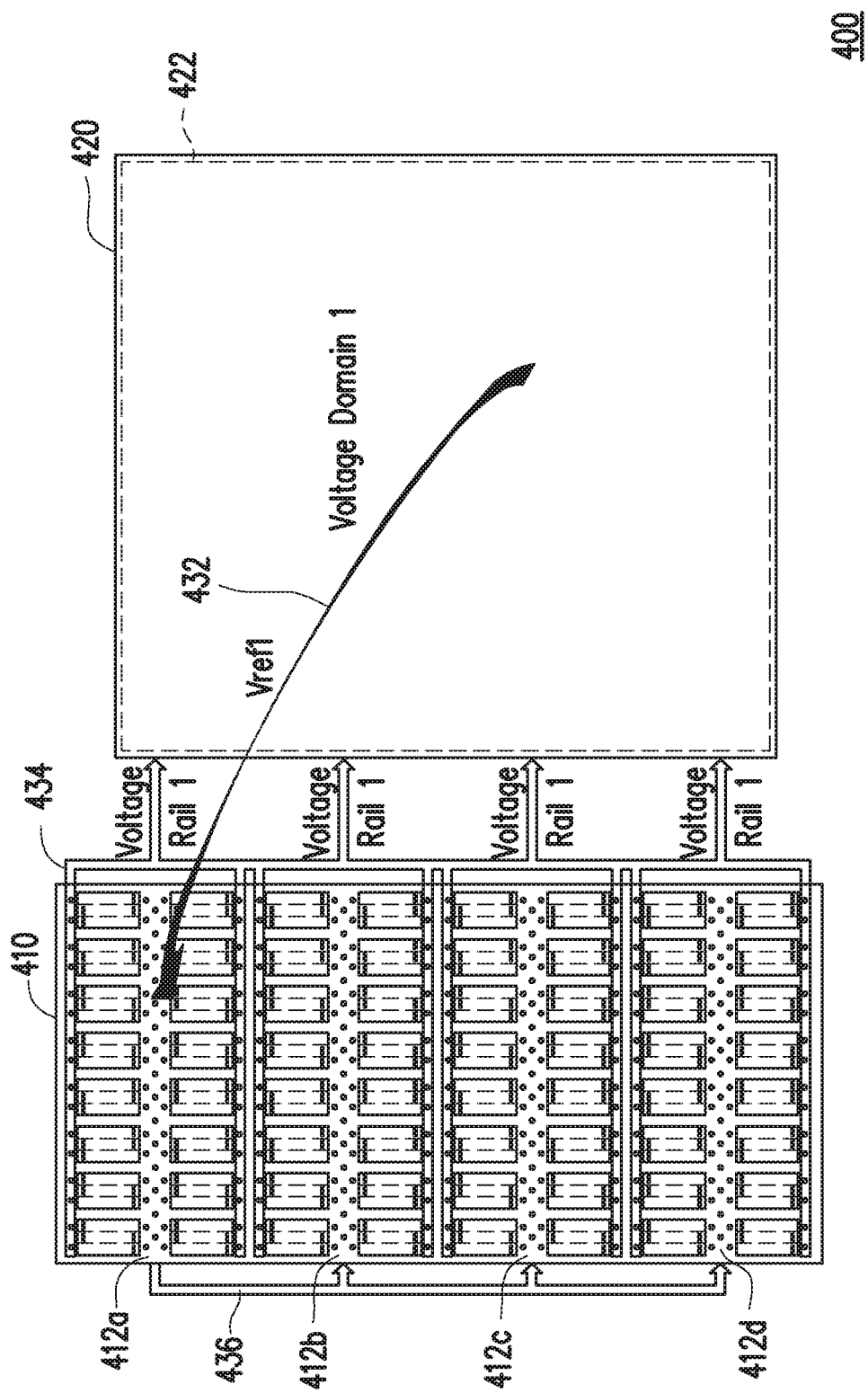
FIG. 6 schematically illustrates a multichip package including a voltage regulator chip and a single-voltage rail chip, according to certain embodiments.

FIG. 6 schematically illustrates a multichip package 400 including a voltage regulator chip 410 and chip 420 having a single voltage rail, such as a CPU chip having one voltage domain 322, according to certain embodiments. In this example, the voltage regulator chip 410 includes N-number of voltage regulator modules 412. In the illustrated embodiment, N is four though it should be understood that this is for illustrative purposes only and N can be any integer number. Voltage regulator chip 410 is identical to voltage regulator chip 310 (FIG. 5) and includes identical voltage regulator modules 412a, 412b, 412c and 412d formed on a common die in the manner discussed above in connection with FIG. 4A. Unlike the chip 320, the chip 420 includes one voltage domain, or at least only one voltage domain with a rail that is provided a regulated voltage by the voltage regulator chip 410. The voltage regulator module 412 are coupled to work together to supply a single regulated voltage to voltage domain 432 of the chip 420. The package provides, for example, a shorted connection 432 through which a single reference voltage and/or control signals are provided from the voltage domain 422 of the chip 420 to the input solder bumps of each of the four voltage regulator modules 412a, 412b, 412c and 412d of the voltage regulator chip 410. The package also provides a common electrical connection (rail) 434 connecting the output solder bumps of all four voltage regulator modules 412a, 412b, 412c, 412d to the voltage domain 422 of the chip 420. Control signals can be coupled through the package (e.g., through electrical connection 436) from the control circuit of one of the voltage regulator modules (e.g., 412a) to the other voltage regulator modules (412b, 412c, 412d) in a master and slave configuration (hereinafter, "master slave"). In this embodiment, one voltage regulator chip 410 including multiple voltage regulator modules 412 configured to provide a single regulated voltage but at a higher current than is available from only one voltage regulator module. That is, the outputs of the voltage regulator modules are shorted together to provide the regulated voltage output to the high current voltage domain of the chip 420. In embodiments, since only one voltage reference (Vref) is needed to regulate the voltage, it is supplied to one of the voltage regulator modules 412a, which acts as a "Master" controlling the other "Slave" modules to keep all the phases of the voltage regulator modules in synchronization. This control is connected through the package, and fuses can be used to select which voltage regulator modules are master versus slaves. Specifically, if we assume each voltage regulator module is configured like the voltage regulator design of FIG. 2A, then the control circuit 70 of the slave voltage regulator modules (e.g., 412b, 412c, 412d) can be turned off or otherwise isolated (e.g., by triggering a fuse) and the phase control signals 60a to 60p from the control circuit 70 (FIG. 2A) of the voltage regulator module 412a can be connected to the corresponding phase circuits 50a to 50p of the slave voltage regulator modules. This connection can be made through the packaging, for example through connection 436 in FIG. 6.

It should be apparent from the discussion of FIG. 5 and FIG. 6 that the same piece of silicon configured in the same way (e.g., each with four identical voltage regulator modules) can provide two totally different voltage regulators with different operating characteristics (e.g., different number of rails and/or current capabilities) only by using the same voltage regulator with different package configurations.

While FIG. 5 shows four voltage regulator modules providing four separate voltage domains, and FIG. 6 shows four voltage regulator modules providing a single regulated voltage for a single domain, it should be apparent that a mix of the two techniques is possible using the same voltage regulator and only a different package configuration. This is referred to herein as a "hybrid" configuration. For example, assume the CPU chip includes two voltage domains, with one domain being a high current domain and the other domain being a low current domain. And assume the same voltage regulator chip 310 or 410 shown in FIG. 5 or FIG. 6, respectively. One of the voltage regulator modules could be configured through the packaging connections to supply the low current domain of the CPU chip (for example, using a configuration as shown in FIG. 5). The other three voltage regulator modules could be slaved together (using the technique of FIG. 6) to provide the regulated voltage to the high current domain of the CPU chip.

Figure 7:
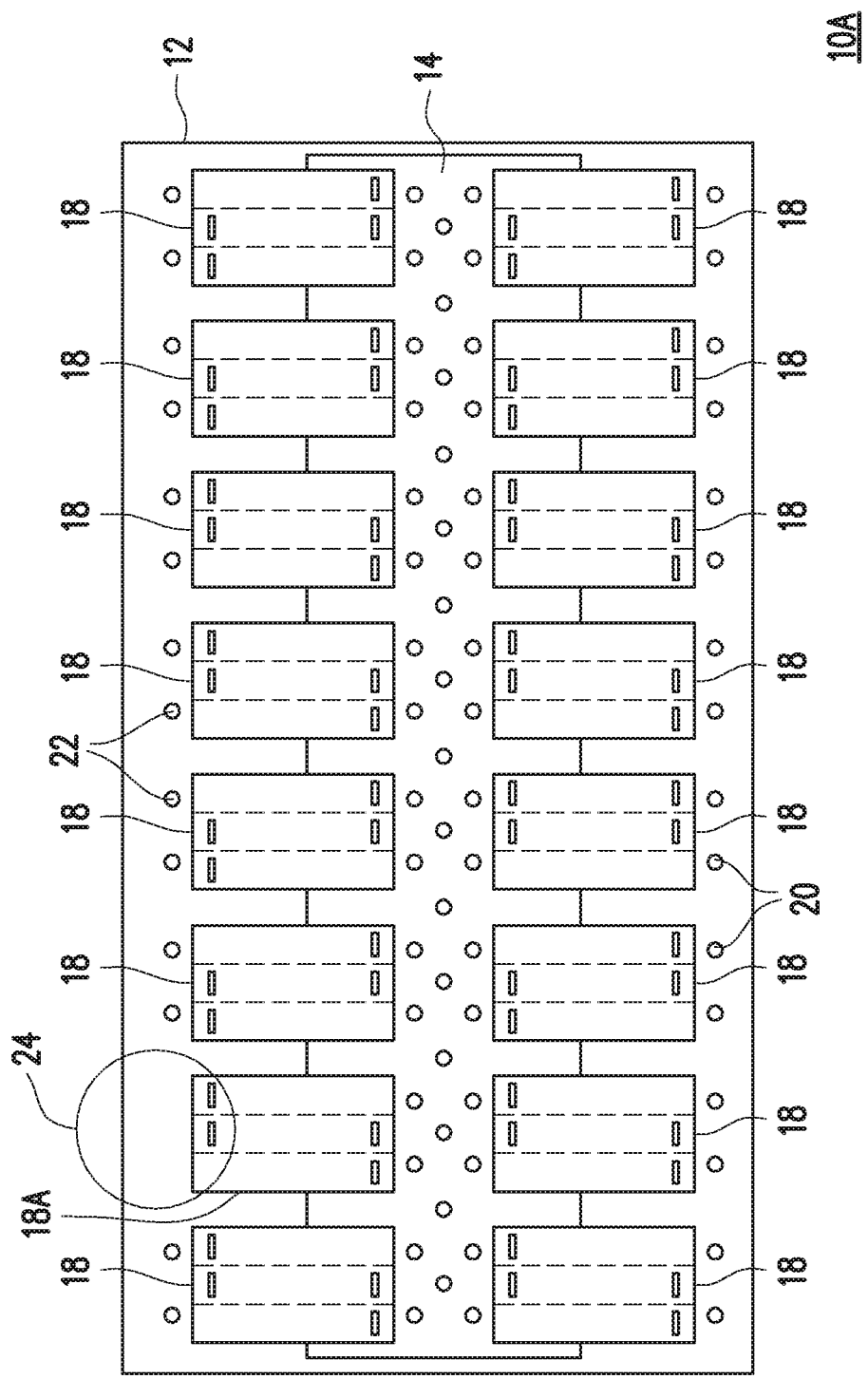
FIG. 7 illustrates an example of a multi-phase voltage regulator having a defective phase disabled or disconnected, according to certain embodiments.

In addition to the modular voltage regulator described herein being configurable for various voltage/current requirements, in certain embodiments the voltage regulator can also be configured with selectively disabled or disconnected phases of the regulator that have defective circuitry. FIG. 7 shows an embodiment of a voltage regulator 10A that is identical to the voltage regulator 10 of FIG. 1 except that a phase has been selectively disabled or disconnected because of a manufacturing defect, for example a defective inductor 18A. This defect can be detected during wafer sort. The solder bumps 22 corresponding to the defective phase in area 24 are removed as shown in FIG. 7. In certain embodiments, this bump removal is accomplished through laser ablation or another method appropriate for removing the bumps or otherwise disconnecting the phase from the voltage regulator output. Internal fuses can be set to indicate to the control logic which phases are functional so that the control logic can balance accordingly.

In embodiments, if N is the maximum number of phases that are desired in the voltage regulator, then the voltage regulator module may be constructed with N+1 or N+2 phases, i.e., with additional phases that can serve to replace defective phases and that would otherwise remain inactive or disconnected in the event of no defects.

Turning to FIG. 8, a vertical cross-section is shown of a portion 500 of voltage regulator 10. As can be seen the voltage regulator has a device layer 502 formed in the silicon that provides devices (e.g., transistors) for the control and driver circuits of the voltage regulator. A metal interconnection layer 504 is formed over the device layer 502 and connects the device layer to the inductor coil 508, which is formed in a dielectric layer 506. The inductor coil 508 is connected to a solder bump 510. As shown in FIG. 8A, an area 500A has had the bump 510 removed by laser ablation or other technique. Laser ablation works by selectively targeting bumps attached to the defective circuitry and removing the bumps from the surface of the silicon. Note that since this is done for defective phase circuits, it is acceptable to slightly damage the inductor 508 and the surrounding area during the removal process, since that inductor is not going to be used. Therefore, the ablation does not need to be overly precise, which helps keep the costs of the process to a minimum.

While described in connection with inductor 18A being defective, it should be apparent that the same bump removal process is effective to disconnect a phase of the voltage regulator that is defective for other reasons, for example, a defective driver circuit associated with the phase.

Figure 9:
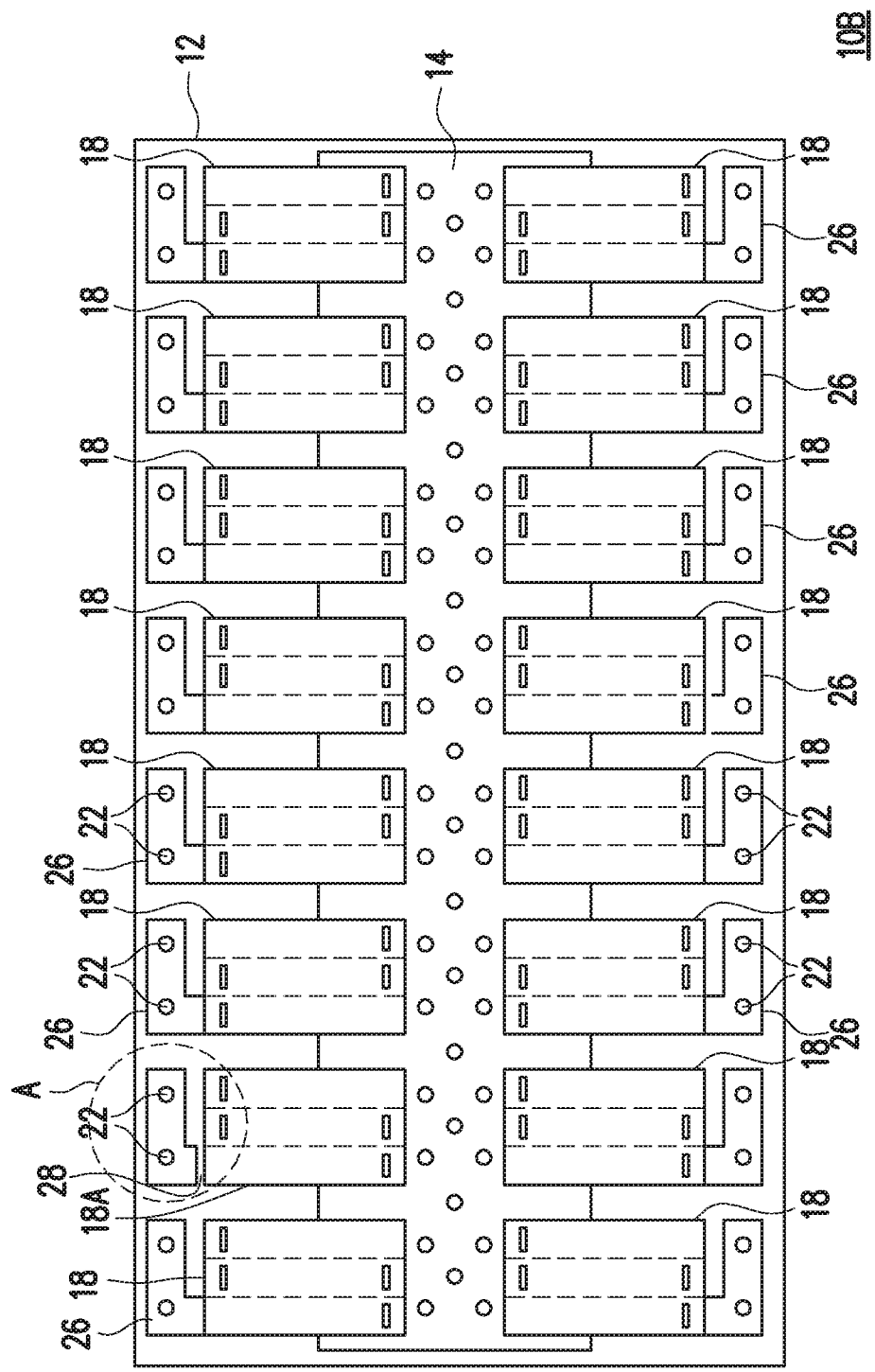
FIG. 9 illustrate an embodiment of a voltage regulator having a phase disconnected from the regulator output, according to certain embodiments.

FIG. 9 illustrates an alternative method to bump removal. FIG. 9 illustrates a voltage regulator 10B that is identical to the voltage regulator 10A of FIG. 7 except that each inductor 18 is connected to a respective solder bump or bumps by a metal or other electrically conductive conductor 26. In this embodiment, a defective inductor 18A (or inductor connected to defective phase circuit) is disconnected at localized region 28 from the voltage output using a nano machining process such as focused ion beam (FIB). A close up of area A is shown in FIG. 9A illustrating a cut across the metal connector 26 to disconnect the inductor 18A from the solder bumps 22 and thus from the voltage output. Since the metal connecting the inductor output to the bumps is relatively wide in the direction of the cut line (for example, in certain embodiments ten times or more wider than the given process) and does not have metal or circuitry underlying it, this FIB process can be automated in certain embodiments and have a high success rate.

Figure 10:
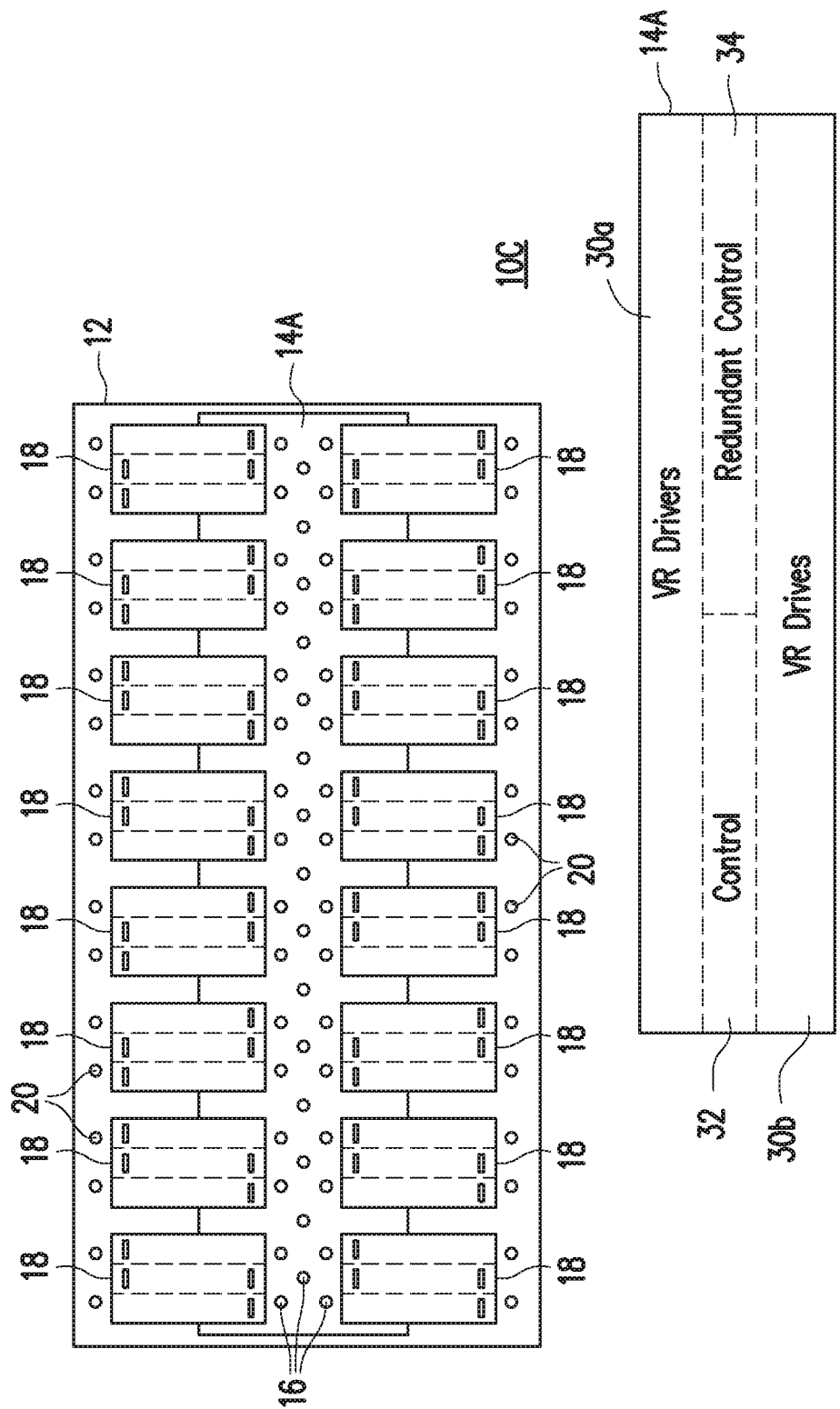
FIG. 10 illustrates an example of a multi-phase voltage regulator having redundant control logic, according to certain embodiments.

FIG. 10 illustrates a voltage regulator 10C that is identical to the voltage regulator 10 of FIG. 1 except with respect to the center region 14A of the die where the drivers and control logic are located. Specifically, the size of the die 12 is largely dictated by the number of inductors and the logic (drivers and particularly control logic) takes up a relatively small part of the silicon. As such, the voltage regulator is provided with redundant control logic 34 in addition to control logic 32. Voltage regulator drivers 30a and 30b are also provided for the phase circuits. When the chip is manufactured, if the control block 32 has a defect, the redundant control 34 can be used, assuming it is defect free. Since the control logic is a small section of the module, it is unlikely that both control logic 32 and redundant control logic 34 would have defects. Fuses would be used to determine which control block is active. For example, if control logic 32 is defective, for example due to a manufacturing defect, then redundant control logic 34 can be connected to the driver circuits by triggering any necessary fuses to connect control logic 34 and disconnect control logic 32. In embodiments, the unused control block 32 is power-gated so no power is wasted on it during operation of the voltage regulator.

Using the techniques described in FIGS. 8, 8A, and FIGS. 9 and 9A along with the redundant control logic approach of FIG. 10 allows for a voltage regulator to be salvaged regardless of inductor, phase circuit or control logic defects, and do so in a cost effect manner. Providing redundant control logic, along with the aforementioned capability to disable phases with defective inductors or voltage drivers, allows for these voltage regulator modules to be manufactured at a very high yield rate.

Figure 11:
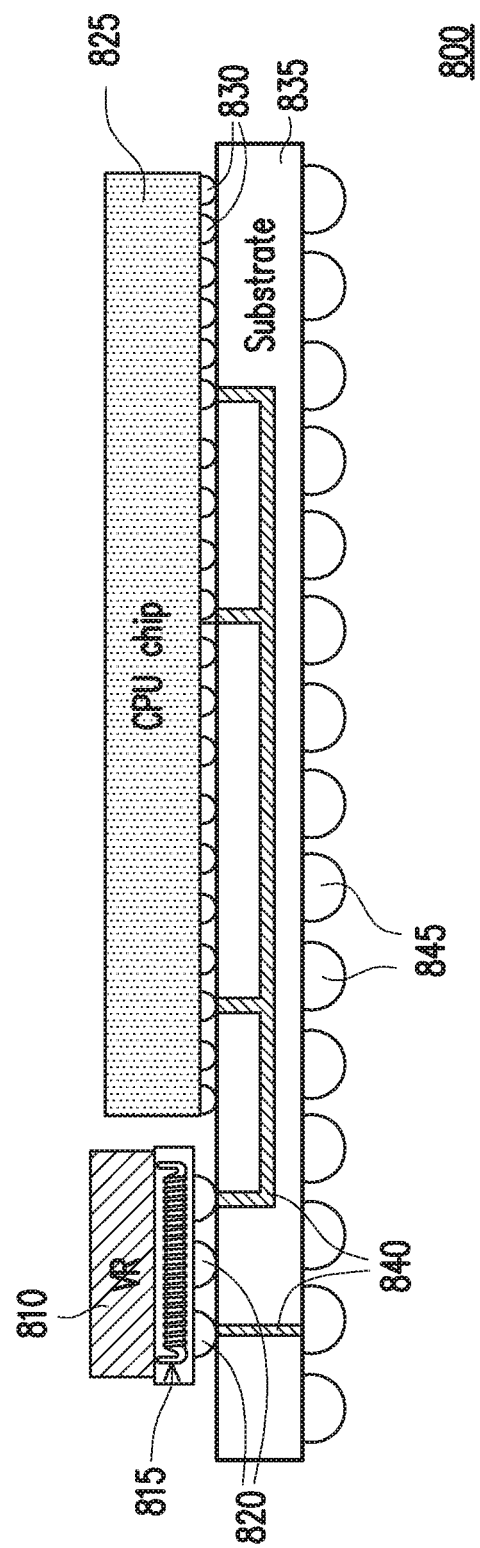
FIG. 11 illustrate a packaged device, according to certain embodiments.

FIG. 11 illustrates a packaged device 800, according to certain embodiments. The packaged device 800 includes a voltage regulator 810 having inductors 815 and conductive bumps 820. The voltage regulator 810 is fabricated in accordance with certain embodiments described herein. The packaged device 800 also includes a chip, such as a CPU chip 825, to which the voltage regulator 810 supplies one or more regulated voltages. The CPU chip includes conductive bumps 830. The voltage regulator 810 and CPU chip 825 are mounted on a substrate 835 and electrically connected to one another through the connections 840 of the substrate 835. The substrate 835 includes conductive bumps 845 that allow for the packaged device 800 to be coupled in a larger system, e.g., to a motherboard of a computer. In certain embodiments, the structure 800 shown in FIG. 11 can, but need not be, encapsulated in an encapsulation layer.

Figure 12:
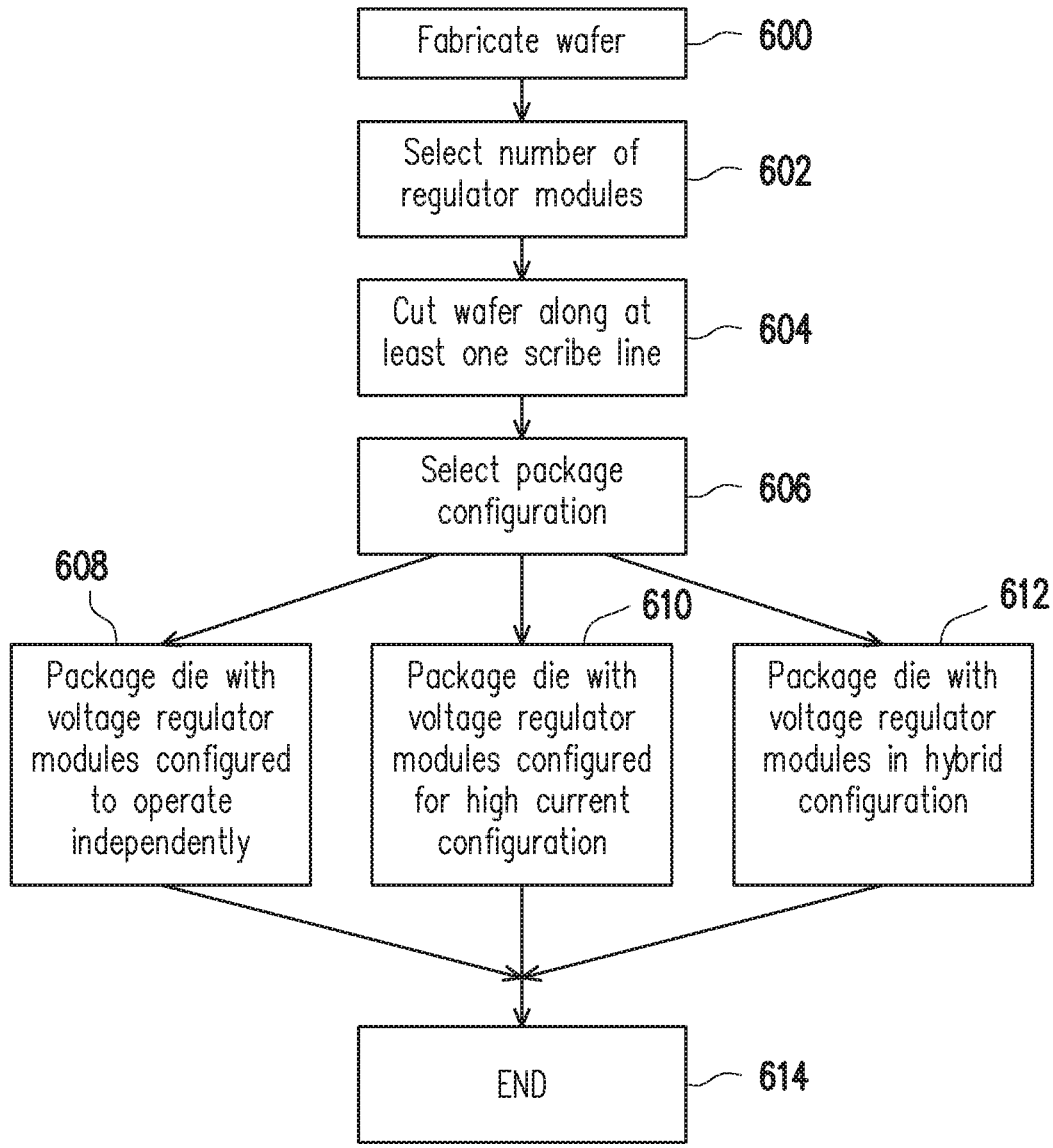
FIG. 12 illustrates a method of making a voltage regulator, according to certain embodiments.

FIG. 12 illustrates a method of making a voltage regulator, according to certain embodiments. At step 600 a wafer is produced having an array of identical voltage regulator modules fabricated thereon. In certain embodiments, the voltage regulator modules are multi-phase voltage regulator modules.

At step 602, a selection is made regarding the number of voltage regulator modules needed for a given design. In embodiments, the number of voltage regulator modules of the design is two or greater.

At step 604, the wafer is cut along at least one scribe line to provide a die having the selected number of voltage regulator modules.

At step 606, a package configuration is selected. Specifically, it is determined whether (a) each voltage regulator module will independently operate and provide its own respective regulated voltage (e.g., to drive a multi-domain chip such as in FIG. 5), (b) the voltage regulator modules are to be coupled together to provide a voltage regulated output for a high current design (e.g., to drive a single power rail as in FIG. 6) or (c) a hybrid design is desired, where the voltage regulator modules are configured to drive multiple domains and where those domains have different current requirements.

At step 608, if option (a) is selected, the die is packaged with at least one other die for which it is providing a regulated voltage using the appropriate package connections.

At step 610, if option (b) is selected, the die is packaged with at least one other die for which it is providing a regulated voltage using the appropriate package connections.

At step 612, if option (c) is selected, the die is packaged with at least one other die for which it is providing a regulated voltage using the appropriate package connections.

At step 614, the method ends. It should be apparent from the foregoing that the same voltage regulator die can be used to provide multiple voltage regulator designs with no changes to the voltage regulator and only the package connections varying.

Figure 13:
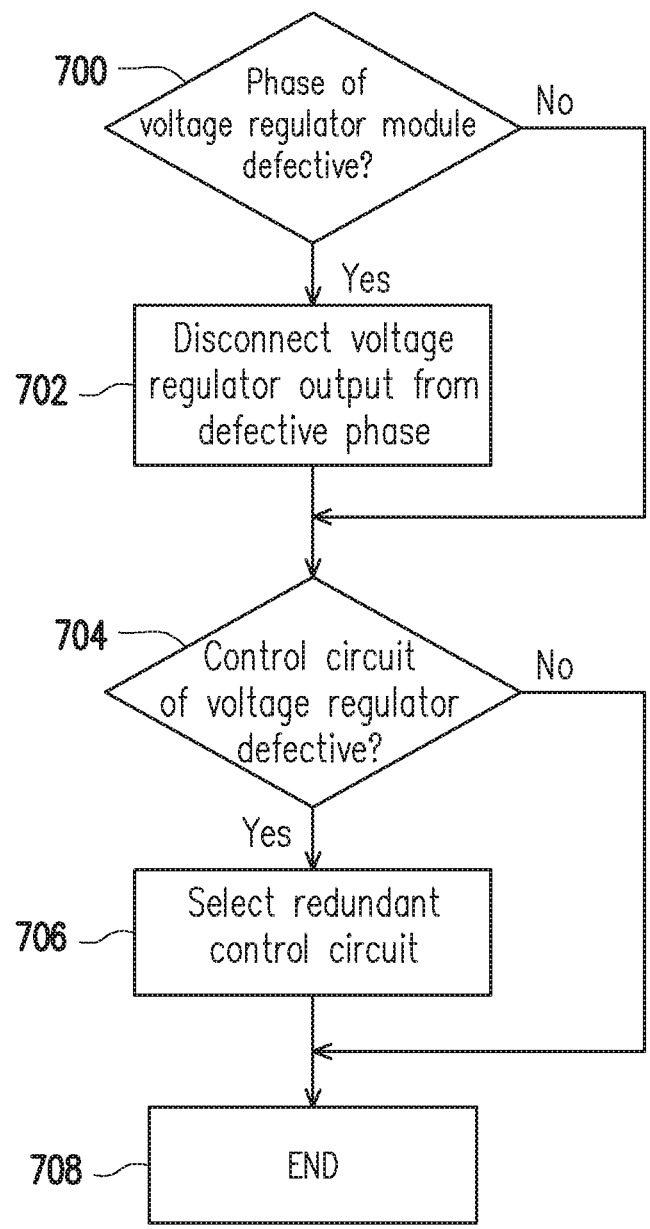
FIG. 13 illustrates a method of reconfiguring a voltage regulator module to account for defects, according to certain embodiments.

FIG. 13 illustrates a method of reconfiguring a voltage regulator module to account for defects, according to certain embodiments. This method may be practiced, for example, as part of or after step 600 in the method of FIG. 12. At step 700, it is determined whether a phase of a multi-phase voltage regulator module is defective. The defect may be an inductor defect or a defect in the driver that drives a phase of the voltage regulator.

If a defect is detected, at step 702, the voltage regulator output is disconnected from the inductor associated with the defective phase. This disconnection can, for example, involve removing the solder bumps connected to the inductor of the defective phase or cutting a conductive connection between the solder bumps and the inductor.

At step 704, it is determined whether a control circuit of the voltage regulator is defective.

At step 706, if a defect is determined, then a redundant control circuit is selected for use in the voltage regulator.

At step 708, the method ends, which may involve proceeding to step 602 or 606 of FIG. 6.

It should be apparent from the foregoing description that the ability to accommodate multiple design requirements from a single voltage regulator die can greatly reduce the time and expense associated with designing custom and specific voltage regulators, while also offering improvements in yield. For example, the master array of voltage regulator modules can be fabricated in high volumes, which provides economies of scale as well as affords opportunities for manufacturing improvements that follow high production volumes. In certain embodiments, these benefits are further enhanced by also using techniques described herein for removing defective phases of multi-phase voltage regulators (whether attributable to defective components, such as defective inductors, or to defective voltage regulator phase drivers), thereby further increasing yield.

In an embodiment, a device includes a semiconductor die, the semiconductor die having formed thereon a plurality of multi-phase voltage regulator modules of the same design formed on a common semiconductor substrate. In an embodiment, the multi-phase voltage regulator module includes a plurality of inductors, with each inductor associated with a respective phase of the multi-phase regulator module. In an embodiment, the voltage regulator module includes a plurality of conductive bumps forming an output of the voltage regulator module, wherein one of the voltage regulator modules has a defective phase, wherein the defective phase is disconnected from the output by disconnecting the inductor associated with the defective phase from the output.

In an embodiment, a packaged device includes a package; a semiconductor die, the semiconductor die having formed thereon a plurality of voltage regulator modules of the same design formed on a common semiconductor substrate; and a chip electrically coupled to the semiconductor die through the package. Electrical connections between the chip and the die through the package are configured such that the plurality of voltage regulators modules of the same design operate together to provide a regulated voltage to the chip or operate independently to provide a plurality of different regulated voltages to the chip. In an embodiment, the chip includes first and second voltage domains, and the semiconductor die includes a first voltage regulator module from the plurality of voltage regulator modules coupled to a first voltage rail of the first voltage domain and a second voltage regulator module from the plurality of voltage regulator modules coupled to a second voltage rail of the second voltage domain. In an embodiment, the first voltage regulator module provides a first regulated voltage different from a second regulated voltage provided by the second voltage regulator module. In an embodiment, the first voltage regulator module is coupled to the chip through the package to receive a first reference voltage from the chip, and the second voltage regulator module is coupled to the chip through the package to receive a second reference voltage from the chip. In an embodiment, the chip includes a first voltage domain, and the semiconductor die includes a first voltage regulator module and a second voltage regulator module from the plurality of voltage regulator modules having outputs coupled together to a voltage rail of the first voltage domain. In an embodiment, the first and second voltage regulator modules are operable in a master slave configuration. In an embodiment, the first voltage regulator module is coupled to the chip through the package to receive a reference voltage from the chip, and a control logic in the first voltage regulator module is coupled to the second voltage regulator module through the package to provide control signals to the second voltage regulator module. In an embodiment, the first and second voltage regulator modules are N-phase voltage regulator modules, where N is an integer number greater than 1, and wherein the control signals include N phase control signals for the N phases of the second voltage regulator module. In an embodiment, the voltage regulator module is a multi-phase voltage regulator module including a plurality of inductors, with each inductor associated with a respective phase of the multi-phase regulator module. In an embodiment, the voltage regulator module includes a plurality of conductive bumps forming an output of the voltage regulator module, wherein one of the voltage regulator modules has a defective phase, wherein the defective phase is disconnected from the output by disconnecting the inductor associated with the defective phase from the output.

In an embodiment, a method of defect correction for a multi-phase voltage regulator, includes the steps of: manufacturing a voltage regulator having a plurality of phases, a plurality of inductors corresponding to the plurality of phases, and a voltage regulator output; identifying a defective phase from the plurality of phases; and disconnecting the voltage regulator output from the defective phase. In an embodiment, each inductor is coupled to a respective conductive bump corresponding to the voltage regulator output, and the disconnecting step includes removing the conductive bump associated with the inductor corresponding to the defective phase. In an embodiment, the removing step includes removing the conductive bump by laser ablation. In an embodiment, each inductor is coupled to a respective conductive bump corresponding to the voltage regulator output, and the disconnecting step includes cutting an electrical connection between a conductive bump and the inductor corresponding to the defective phase. In an embodiment, the cutting step includes using focused ion beam. In an embodiment, the voltage regulator includes control logic and redundant control logic, and the method further includes the step of engaging the redundant control logic and disengaging the control logic if the control logic is defective. In an embodiment, the engaging and disengaging includes triggering at least one fuse in the voltage regulator module.

In an embodiment, a method of making a voltage regulator includes the steps of: forming an array of voltage regulator modulators of the same design formed on a common semiconductor substrate; selecting a number of regulator modules to be included in a voltage regulator from the array of voltage regulator modulators, wherein the number is an integer number greater than 1; cutting the wafer to provide a die including the selected number of voltage regulator modules; and packaging the die with a chip such that the die is electrically coupled with the chip to provide a regulated voltage. In an embodiment, the chip includes first and second voltage domains, and the method further includes coupling a first voltage regulator module from the plurality of voltage regulator modules to a first voltage rail of the first voltage domain and coupling a second voltage regulator module from the plurality of voltage regulator modules to a second voltage rail of the second voltage domain. In an embodiment, the chip includes a first voltage domain, and the semiconductor die includes a first voltage regulator module and a second voltage regulator module from the plurality of voltage regulator modules, and the method further includes coupling outputs coupled of the first and second voltage regulator modules together to a voltage rail of the first voltage domain. In an embodiment, the method further includes coupling the first and second voltage regulator modules in a master slave configuration.

In an embodiment, a device includes a package; a semiconductor die, the semiconductor die having formed thereon a plurality of voltage regulator modules of the same design formed on a common semiconductor substrate; and a CPU chip electrically coupled to the semiconductor die through the package to receive a regulated voltage from the semiconductor die, wherein the CPU chip includes first and second voltage domains, wherein a first voltage regulator module from the plurality of voltage regulator modules is coupled through the package to the first voltage domain to receive a first reference voltage and to provide a first regulated voltage using the first reference voltage, and wherein a second voltage regulator module from the plurality of voltage regulator modules is coupled through the package to the second voltage domain to receive a second reference voltage and to provide a second regulated voltage using the first reference voltage. In an embodiment, the package includes a circuit board to which the semiconductor die and the CPU chip are bonded.

In an embodiment, a device includes a package; a semiconductor die, the semiconductor die having formed thereon a plurality of voltage regulator modules of the same design formed on a common semiconductor substrate; and a CPU chip electrically coupled to the semiconductor die through the package to receive a regulated voltage from the semiconductor die, wherein the CPU chip includes a first voltage domain, wherein outputs of first and second voltage regulator modules from the plurality of voltage regulator modules are coupled together to the first voltage domain to provide a regulated voltage using a reference voltage from the CPU chip, wherein the first voltage regulator module is coupled to the CPU through the package to receive the reference voltage, and wherein the second voltage regulator module is a slave in a master slave configuration to the first voltage regulator module, with the first voltage regulator module providing control signals to the second voltage regulator module through the package. In an embodiment, the package includes a circuit board to which the semiconductor die and the CPU chip are bonded. In an embodiment, the voltage regulator modules are N-phase voltage regulator modules and the first voltage regulator module provides N respective control signals to the N-phases of the second voltage regulator module. In an embodiment, the CPU chip includes a second voltage domain, and a third voltage regulator module from the plurality of voltage regulator modules is coupled to the second voltage domain through the package to provide a regulated voltage for the second voltage domain.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of defect correction for a multi-phase voltage regulator, comprising the steps of:
    manufacturing a voltage regulator chip comprising:
        a voltage regulator having a plurality of phases and a plurality of inductors corresponding to the plurality of phases; and
        a plurality of conductive bumps, wherein each inductor is coupled to a respective conductive bump;
    connecting the voltage regulator chip to a package substrate to electrically couple the plurality of conductive bumps together as a voltage regulator output;
    identifying a defective phase from the plurality of phases; and
    disconnecting the voltage regulator output from the defective phase.

2. The method of claim 1, wherein the disconnecting step comprises removing the conductive bump associated with the inductor corresponding to the defective phase, the removing step occurring before the step of connecting the voltage regulator chip to the package substrate.

3. The method of claim 2, wherein the removing step comprises removing the conductive bump by laser ablation.

4. The method of claim 1, wherein the disconnecting step comprises cutting an electrical connection between a conductive bump and the inductor corresponding to the defective phase, the cutting step occurring before the step of connecting the voltage regulator chip to the package substrate.

5. The method of claim 4, wherein the cutting step comprises using a nano machining process.

6. The method of claim 5, wherein the nano machining process comprises focused ion beam.

7. The method of claim 1, wherein the voltage regulator includes control logic and redundant control logic, the method further comprising the step of engaging the redundant control logic and disengaging the control logic if the control logic is defective.

8. The method of claim 7, wherein the engaging and disengaging includes triggering at least one fuse in the voltage regulator module.

9. A method of defect correction for a multi-phase voltage regulator, the multi-phase voltage regulator having N phases, comprising the steps of:
    manufacturing a voltage regulator chip having a voltage regulator having Y phases, a plurality of inductors corresponding to the Y phases, and a plurality of conductive bumps, wherein each inductor is coupled to a respective conductive bump, wherein Y is greater than N;
    connecting the voltage regulator chip to a package substrate to electrically couple the plurality of conductive bumps together as a voltage regulator output; and
    disconnecting the voltage regulator output from a portion of the Y phases, thereby providing the multi-phase voltage regulator having N phases.

10. The method of claim 9, further comprising the step of prior to the disconnecting step, identifying a defective phase from the Y plurality of phases, wherein the disconnecting step comprises disconnecting the voltage regulator output from the defective phase.

11. The method of claim 9,
    wherein the manufacturing step comprises manufacturing the voltage regulator to have N phases and at least one additional phase for replacing a defective phase,
    the method further comprising the step of determining that the N phases are not defective, and the disconnecting step comprises disconnecting the voltage regulator output from the at least one additional phase.

12. The method of claim 9, wherein the disconnecting step comprises removing any conductive bump associated with any inductor corresponding to the portion of the Y phases, the removing step occurring before the step of connecting the voltage regulator chip to the package substrate.

13. The method of claim 12, wherein the removing step comprises removing the conductive bump by laser ablation.

14. The method of claim 9, wherein the disconnecting step comprises cutting an electrical connection between any conductive bump and any inductor corresponding to the portion of the Y phases, the cutting step occurring before the step of connecting the voltage regulator chip to the package substrate.

15. The method of claim 14, wherein the cutting step comprises using a nano machining process.

16. The method of claim 15, wherein the nano machining process comprises focused ion beam.

17. The method of claim 9, wherein the voltage regulator includes control logic and redundant control logic, the method further comprising the step of engaging the redundant control logic and disengaging the control logic if the control logic is defective.

18. The method of claim 17, wherein the voltage regulator includes a plurality of phase driver circuits, the method further comprising the step of connecting the redundant control logic to the phase driver circuits if it is determined that the control logic is defective.

19. The method of claim 18, wherein the engaging and disengaging includes triggering at least one fuse in the voltage regulator module.

20. A semiconductor device comprising:
a voltage regulator chip comprising a multi-phase voltage regulator, the multi-phase voltage regulator having N active phases, the multi-phase regulator being manufactured with more than N total phases, wherein at least one of the more than N total phases is disconnected to provide the voltage regulator with the N active phases, a plurality of inductors corresponding to the N active phases, and a plurality of conductive bumps, wherein each inductor is coupled to a respective conductive bump; and
a package substrate, the voltage regulator chip being connected to the package substrate to electrically couple the plurality of conductive bumps together as a voltage regulator output.

* * * * *